(12) United States Patent
Chae et al.

(10) Patent No.: US 7,465,612 B2
(45) Date of Patent: Dec. 16, 2008

(54) FABRICATING METHOD FOR THIN FILM TRANSISTOR SUBSTRATE AND THIN FILM TRANSISTOR SUBSTRATE USING THE SAME

(75) Inventors: Gee Sung Chae, Incheon (KR); Mi Kyung Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 464 days.

(21) Appl. No.: 11/312,605

(22) Filed: Dec. 21, 2005

(65) Prior Publication Data
US 2006/0284181 A1  Dec. 21, 2006

(30) Foreign Application Priority Data
Jun. 21, 2005  (KR) .................. 10-2005-0053714

(51) Int. Cl.
*H01L 21/00* (2006.01)
*H01L 21/84* (2006.01)
*H01L 21/20* (2006.01)

(52) U.S. Cl. .................. 438/149; 438/480; 977/938

(58) Field of Classification Search ......... 438/149–157, 438/480; 977/938
See application file for complete search history.

(56) References Cited

U.S. PATENT DOCUMENTS

| 7,365,395 B2 * | 4/2008 | Stumbo et al. ............. 438/253 |
| 7,405,129 B2 * | 7/2008 | Afzali-Ardakani et al. .. 438/289 |
| 2006/0226425 A1 * | 10/2006 | Chae et al. ................... 257/59 |

* cited by examiner

*Primary Examiner*—Cuong Q Nguyen
(74) *Attorney, Agent, or Firm*—Birch, Stewart, Kolasch & Birch, LLP

(57) ABSTRACT

A thin film transistor substrate and its fabrication method are discussed. According to an embodiment, the fabricating method of a thin film transistor substrate includes forming a gate electrode on a substrate; forming a gate insulating film on the gate electrode, the gate insulating film having a groove in an area corresponding to an area where an active layer of a thin film transistor is to be formed; forming the active layer of the thin film transistor by use of a nanowire in the groove of the gate insulating film; and forming a source electrode and a drain electrode on the active layer.

14 Claims, 18 Drawing Sheets

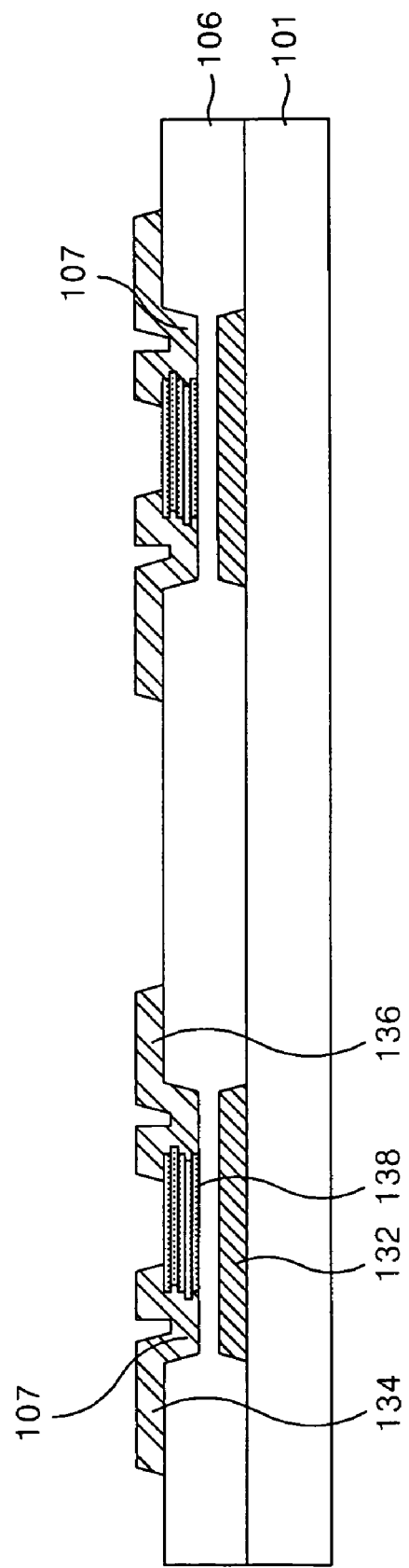

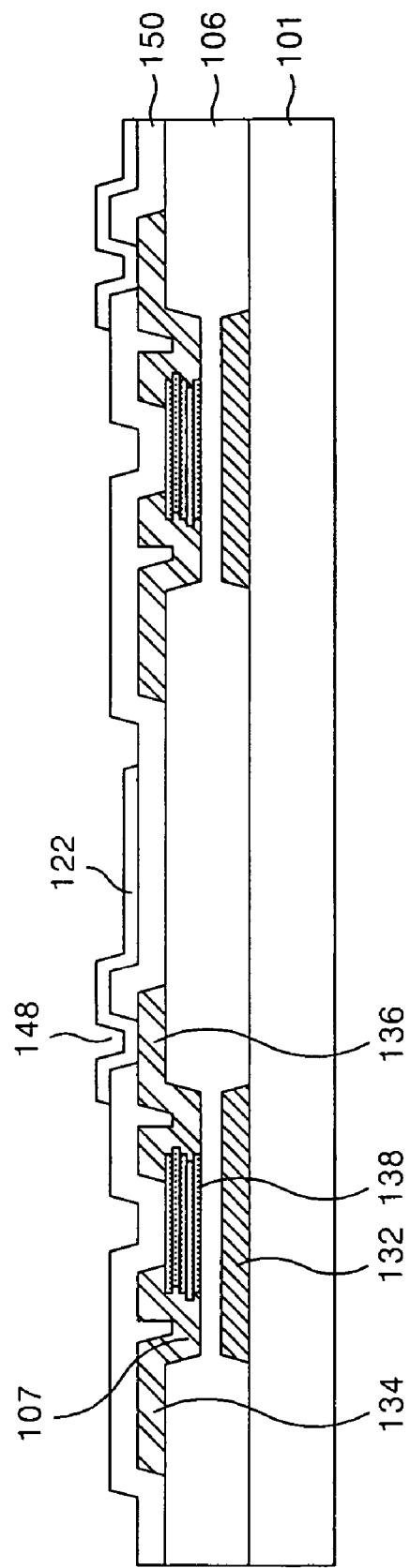

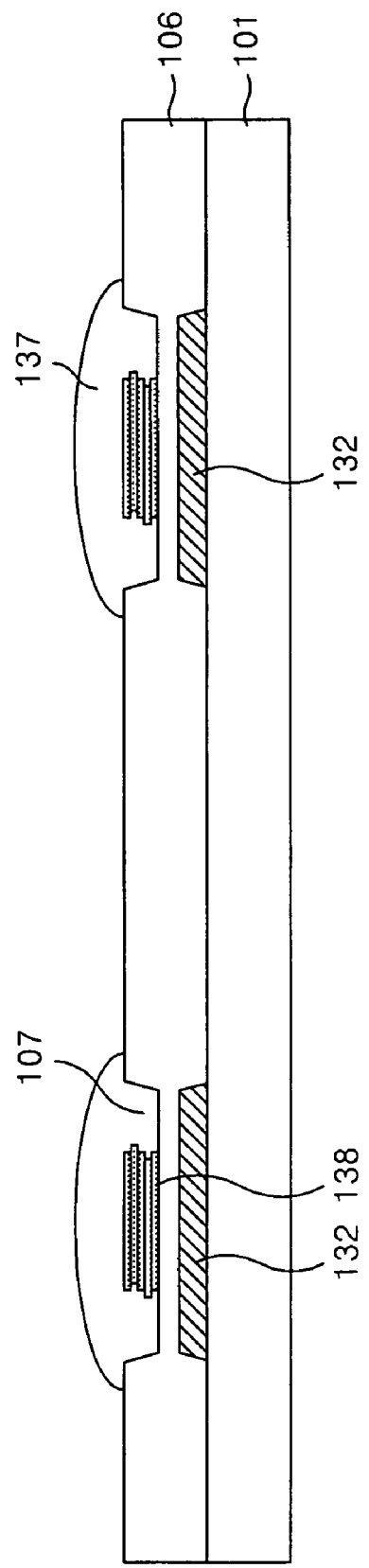

FABRICATING METHOD FOR THIN FILM TRANSISTOR SUBSTRATE AND THIN FILM TRANSISTOR SUBSTRATE USING THE SAME

This application claims the priority benefit of the Korean Patent Application No. 10-2005-0053714 filed on Jun. 21, 2005 in Republic of Korea, the entire contents which are hereby incorporated by reference.

BACKGROUND OF THE INVENTION

1. Field of the Invention

The present invention relates to a thin film transistor substrate and a fabricating method of the thin film transistor substrate, and more particularly to a fabricating method of a thin film transistor substrate that is adaptive for improving a yield of the thin film transistor substrate by use of a nanowire, and a thin film transistor substrate using the same.

2. Description of the Related Art

Generally, a liquid crystal display (LCD) device controls a light transmittance of a liquid crystal by use of an electric field, thereby displaying a picture.

FIGS. 1 and 2 are respectively a perspective plan view and a cross sectional view representing a liquid crystal display panel of a related art.

Referring to FIGS. 1 and 2, the liquid crystal display panel includes a thin film transistor (hereinafter, referred to as "TFT") substrate 70 and a color filter substrate 80 which face each other with a liquid crystal 16 therebetween.

The color filter substrate 80 includes a black matrix 18 which is formed on an upper substrate 11 at locations corresponding to gate lines 2 and data lines 4 crossing each other to define cell areas; a color filter layer 12 formed in the cell areas defined by the black matrix 18 for realizing color; and a common electrode 14 to form a vertical electric field with pixel electrodes 22.

The TFT substrate 70 of the liquid crystal display panel includes the gate lines 2 and the data lines 4 which are formed on a lower substrate 1 to cross each other with a gate insulating film 6 threbetween; a TFT 30 formed at each crossing part of the corresponding gate and data lines 2 and 4; a pixel electrode 22 formed in each cell area provided in the crossing structures of the gate lines 2 and the data lines 4.

For each TFT, the TFT 30 supplies a pixel signal of the corresponding data line 4 to the corresponding pixel electrode 22 in response to a gate signal of the corresponding gate line 2. To this end, the TFT 30 includes a gate electrode 32 connected to the gate line 2, a source electrode 34 connected to the data line 4, a drain electrode 36 connected to the pixel electrode 22 via a contact hole 48, and an active layer 38 which overlaps the gate electrode 32 and forms a channel between the source electrode 34 and the drain electrode 36. An ohmic contact layer 40 for being in ohmic contact with the source electrode 34 and the drain electrode 36 is formed on the active layer 38.

A plurality of thin films inclusive of the TFTs 30 of the TFT substrate 80 of the liquid crystal display panel are mainly formed by a photolithography process using a mask according to a related art. However, a study of forming the active layer 38 of the TFT 30 by use of a nanowire is being made.

FIG. 3 is a cross sectional diagram representing another example of a TFT substrate in the LCD panel of the related art.

Referring to FIG. 3, the TFT substrate of the related art includes the active layer 38 of the TFT formed by use of a nanowire 39. The TFT substrate of FIG. 3 is the same as the TFT substrate of FIG. 2, except that the active layer 38 of the TFT is formed by use of the nanowire 39. Thus the explanation for the same elements will be omitted.

The nanowire 39, which forms the active layer 38 of the TFT, is formed in a structure, as shown in FIG. 4, where an inorganic and organic insulator 39B encompasses a semiconductor material 39A.

As shown in FIGS. 5A and 5B, the active layer 38 of FIG. 3 is formed by use of the nanowire 39, which is scattered over the gate electrode 32 where the gate insulating film 6 is spread, specially over a location where the active layer 38 of the TFT is to be formed after randomly scattering the nanowire 39 on the lower substrate 1 where the gate electrode 32 and the gate insulating film 6 are formed.

However, the formation of the active layer 38 of the TFT by use of the nanowire 39 has a disadvantage in that the yield of the TFT substrate is decreased, because the nanowire 39 is not correctly placed on a right location where the active layer 38 is to be formed since the nanowire 39 is randomly scattered on the lower substrate 1 in order to form the active layer 38 of the TFT. For example, as in FIGS. 5A and 5B, there arises a problem that the nanowire 39 is wasted because the nanowire 39 is scattered and provided at an arbitrary location (A) other than a location where the active layer 38 of the TFT is to be formed. Also the nanowire 39 may not be aligned with the gate electrode as shown in "B" of FIG. 5B. Consequently, there arises a problem that the lower substrate 1 cannot be used, because it includes the nanowire 39 scattered in areas other than the locations where the active layer 38 of the TFT is to be formed.

In order to address these problems, there has been proposed a method that the nanowire 39 is spread over only the area where the active layer 38 of the TFT is to be formed on the lower substrate 1 by use of an inkjet. In this method, the nanowire 39 is spread by use of the inkjet over an area where the active layer 38 of the TFT on the lower substrate 1 is to be formed, after dissolving the nanowire 39 in an alcohol system solvent such as ethanol, methanol, etc. However, in this case, the alcohol system solvent in which the nanowire 39 is dissolved has a problem of being spread to an area other than an area where the nanowire 39 is spread (i.e., an area other than an area where the active layer 38 of the TFT is to be formed) due to its characteristic. Because of this feature, there is a problem in that the yield of the TFT substrate formed by the related art method is decreased due to a patterning defect of the active layer 38 of the TFT.

SUMMARY OF THE INVENTION

Accordingly, it is an object of the present invention to provide a fabricating method of a thin film transistor substrate that is adaptive for improving a yield of the thin film transistor substrate by use of a nanowire, and a thin film transistor substrate using the same.

It is another object of the present invention to provide a thin film transistor substrate of an LCD device and a method of forming the thin film transistor substrate, which address the limitations and disadvantages associated with the related art.

In order to achieve these and other objects of the invention, a fabricating method of a thin film transistor substrate according to an aspect of the invention includes forming a gate electrode on a substrate; forming a gate insulating film on the gate electrode, the gate insulating film having a groove in an area corresponding to an area where an active layer of a thin film transistor is to be formed; forming the active layer of the thin film transistor by use of a nanowire in the groove of the gate insulating film; and forming a source electrode and a drain electrode on the active layer.

According to another aspect of the present invention, there is provided a thin film transistor substrate, comprising: a substrate; a gate electrode on the substrate; a gate insulating film on the gate electrode and having a groove in an area corresponding to an area where an active layer of a thin film transistor is to be formed; the active layer of the thin film transistor formed by use of a nanowire in the groove of the gate insulating film; and a source electrode and a drain electrode on the active layer.

According to another aspect of the present invention, there is provided a method of forming a thin film transistor of a liquid crystal display (LCD) device, the method comprising: forming a gate electrode on a substrate; forming a gate insulating film on the gate electrode, the gate insulating film having a groove in an area corresponding to an area where an active layer of the thin film transistor is to be formed; forming the active layer of the thin film transistor by forming a nanowire in the groove of the gate insulating film; and forming a source electrode and a drain electrode of the thin film transistor on the active layer.

According to another aspect of the present invention, there is provided a liquid crystal display (LCD) device comprising: first and second substrates; and a liquid crystal layer between the first and second substrates, wherein the first or second substrate includes a plurality of thin film transistors (TFTs), each TFT including: a gate electrode on a base substrate, a gate insulating film on the gate electrode and having a groove in an area corresponding to an area where an active layer of the corresponding TFT is to be formed, the active layer made of a nanowire and being formed in the groove of the gate insulating film, and a source electrode and a drain electrode on the active layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

These and other objects of the invention will be apparent from the following detailed description of the embodiments of the present invention with reference to the accompanying drawings, in which:

FIGS. 7A to 7E are cross sectional views for explaining a fabricating method of the thin film transistor substrate of FIG. 6 according to an embodiment of the present invention;

FIGS. 8A to 8D are cross sectional views representing a formation of an active layer of a thin film transistor in the thin film transistor substrate of FIG. 6 by use of a nanowire according to an embodiment of the present invention;

DETAILED DESCRIPTION OF THE PREFERRED EMBODIMENTS

Reference will now be made in detail to the preferred embodiments of the present invention, examples of which are illustrated in the accompanying drawings.

With reference to FIGS. 6 to 10, embodiments of the present invention will be explained as follows. The following description focuses on a TFT substrate of an LCD device; however, the LCD device of the present invention includes other components, e.g., a color filter substrate, a liquid crystal layer, driving circuits, etc. known in the art. All the components of the TFT substrate and the LCD device are operatively coupled and provided.

Figure 6:
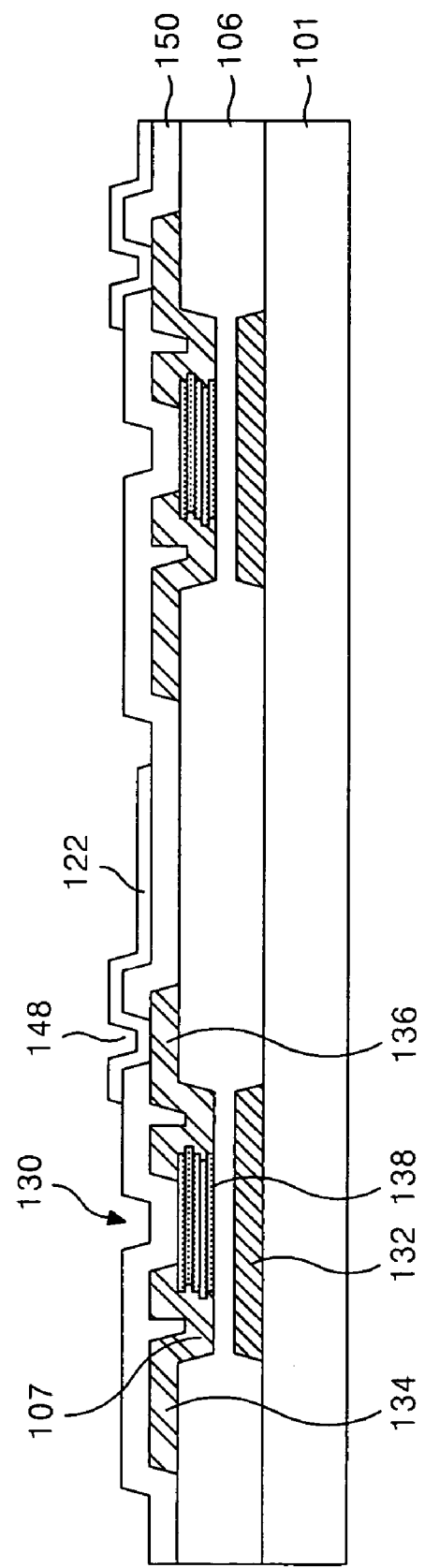
FIG. 6 is a cross sectional view representing a thin film transistor substrate of an LCD device according to an embodiment of the present invention.

FIG. 6 is a cross sectional view representing a TFT substrate of an LCD device according to an embodiment of the present invention.

Referring to FIG. 6, the TFT substrate according to the embodiment of the present invention includes gate lines and data lines which are formed on a lower substrate 101 to cross each other with a gate insulating film 106 therebetween; a TFT 130 formed at each crossing part of the gate and data lines; and a pixel electrode 122 formed in a cell area provided in each crossing structure of the gate lines and the data lines.

For each TFT, the TFT 130 supplies a pixel signal of the corresponding data line to the corresponding pixel electrode 122 in response to a gate signal of the corresponding gate line. To this end, each TFT 130 includes a gate electrode 132 connected to the gate line, a source electrode 134 connected to the data line, a drain electrode 136 connected to the pixel electrode 122, and an active layer 138 which is formed above the gate electrode 132 and forms a channel between the source electrode 134 and the drain electrode 136.

Figure 10:
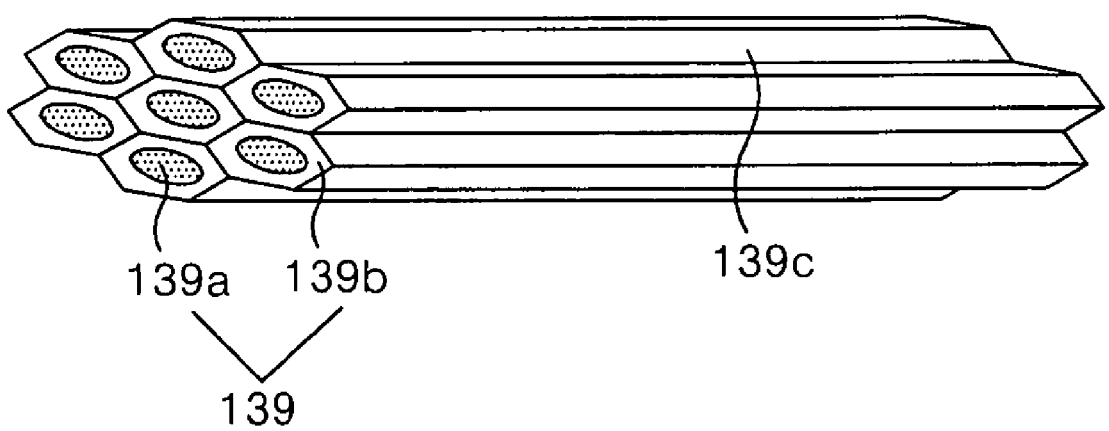
FIG. 10 is a perspective plan view representing one example of a nanowire used to form an active layer of FIGS. 6 and 9 according to an embodiment of the present invention.

The active layer 138 of the TFT 130 according to an embodiment of the present invention is formed by use of a nanowire 139 (e.g., as shown in FIG. 10). Particularly, in the gate insulating film 106, a groove 107 is formed in an area corresponding to an area where the active layer 138 of the TFT 130 is to be formed, to receive the nanowire 139 therein.

A fabricating method of the TFT substrate of FIG. 6 according to an embodiment of the present invention is explained as follows, in reference to FIGS. 7A to 7E. FIGS. 7A-7E show formation of two TFTs; however, the invention covers any number of TFTs. The TFT substrate of the LCD device according to the present invention includes a plurality of such TFTs.

Figure 7A:
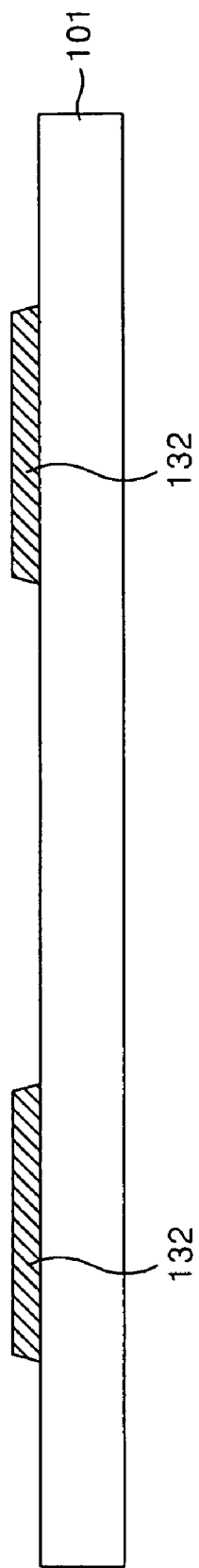

Referring to FIG. 7A, the gate line (not shown) and the gate electrode 132 are formed on the lower substrate 101 by use of, e.g., a first mask process. To describe this in detail, a gate metal layer is formed on the lower substrate 101 by a deposition method such as sputtering. Subsequently, the gate metal layer is patterned by a photolithography process and an etching process using a first mask, thereby forming the gate line and the gate electrode 132. Herein, aluminum system metal inclusive of aluminum, aluminum/neodymium (Al/Nd) can be used as the material for the gate metal layer.

Figure 7B:
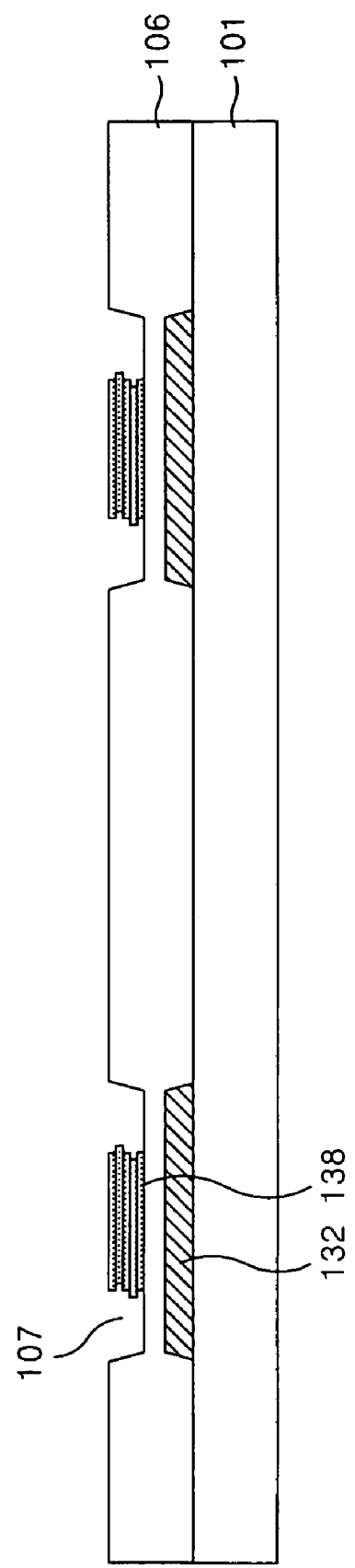

Referring to FIG. 7B, the gate insulating film 106 is formed with the groove 107 in an area corresponding to an area where the active layer 138 of the TFT is to be formed, and the active layer 138 of the TFT is formed in the groove 107, by a patterning process by use of a soft mold or hard mold and a spreading process by use of an inkjet on the lower substrate 101 where the gate line and the gate electrode 132 are formed.

To describe this in detail, after spreading an inorganic or organic hybrid insulating material on the entire surface of the lower substrate 101 where the gate line and the gate electrode 132 are formed, the soft mold or hard mold, which has a projected part in an area corresponding to an area where the active layer 138 of the TFT is to be formed and a groove in other area, is made to be aligned and the soft mold or the hard mold is made to be in contact with the inorganic or organic hybrid insulating material, thereby forming the gate insulating film 106 having the groove 107 in the area corresponding to the area where the active layer 138 of the TFT is to be formed. Subsequently, the nanowire 139 (FIG. 10) is spread into the groove 107 of the gate insulating film 106 by use of the inkjet or the like, thereby forming the active layer 138 of the TFT in each groove 107. Herein, the nanowire 139 is spread into the groove 107 of the gate insulating film 106 by use of the inkjet, etc. in a state of being dissolved in a solvent or an alcohol system solvent such as ethanol and methanol in order to be spread by use of the inkjet.

And then, the source electrode 134 and the drain electrode 136 are formed by use of, e.g., a second mask on the lower substrate 101 where the active layer 138 of the TFT is formed, as shown in FIG. 7C.

To describe this in detail, a source/drain metal layer is formed by a deposition method such as PECVD, sputtering, etc. on the lower substrate 101 where the active layer 138 of the TFT is formed. And then, a photoresist film is formed on the source/drain metal layer and a photoresist pattern is formed on the lower substrate 101 by use of the second mask.

The source/drain metal layer is patterned by the etching process using the photoresist pattern as a mask, thereby forming the drain electrode 136 and the source electrode 134 connected to the corresponding data line. And, a portion of the source electrode 134 and the drain electrode 136 that corresponds to a channel part of the TFT are removed by the etching process, thereby forming a channel of the TFT where the active layer 138 of the TFT is exposed. Herein, a metal such as molybdenum Mo, copper Cu, etc. can be used as the material for the source/drain metal layer.

Figure 7D:
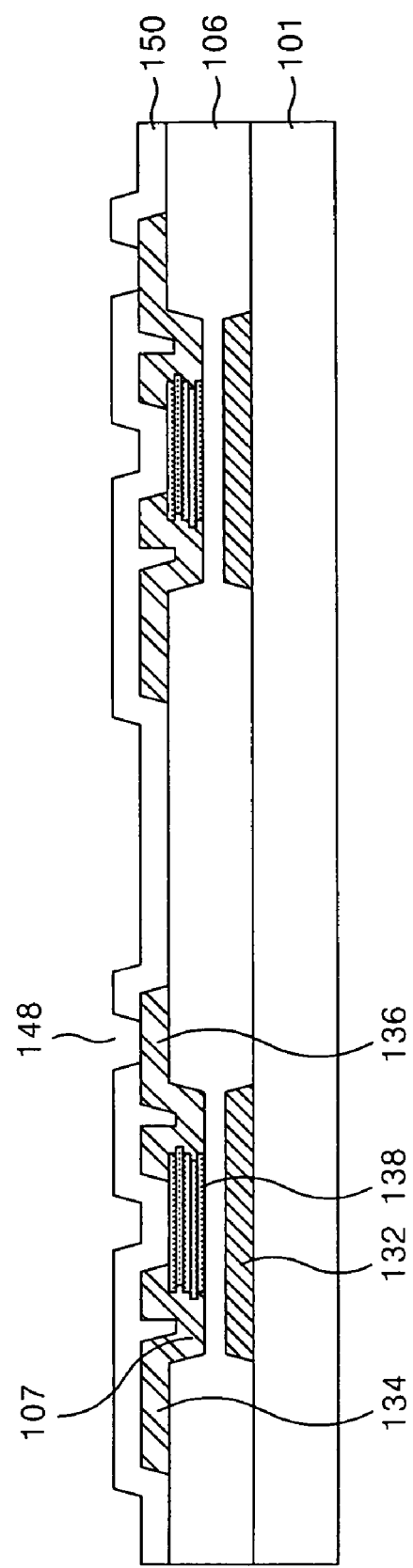

Subsequently, a passivation film 150 is formed by use of, e.g., a third mask, as shown in FIG. 7D, on the lower substrate 101 where the source electrode 134 and the drain electrode 136 are formed.

To describe this in detail, an inorganic or organic insulating material and a photoresist film are spread over the entire surface of the lower substrate 101 and the photoresist pattern is formed by use of the third mask. The inorganic or organic insulating material is patterned by an etching process using the photoresist pattern as a mask, thereby forming a contact hole 148 which exposes a portion of the drain electrode 136.

Thereafter, the pixel electrode 122 is formed by use of, e.g., a fourth mask, as shown in FIG. 7E, on the lower substrate 101 where the passivation film 150 is formed. The pixel electrode 122 is in contact with the portion of the drain electrode 136 exposed through the contact hole 148. Herein, any one of indium tin oxide ITO, tin oxide TO, indium tin zinc oxide ITZO and indium zinc oxide IZO can be used as the material for the pixel electrode 122.

Figure 1:
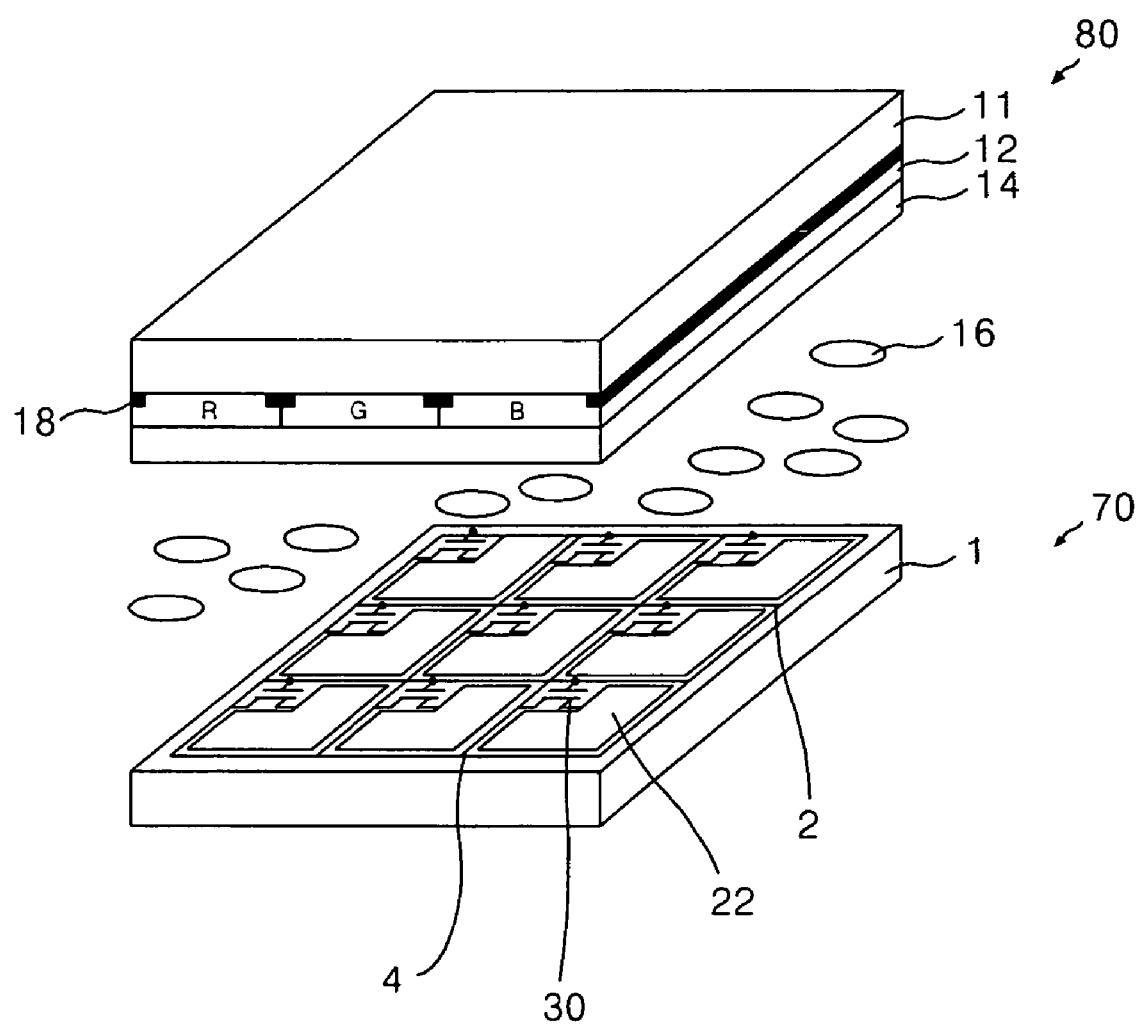
FIG. 1 is a perspective plan view representing a liquid crystal display panel of the related art.
Figure 2:
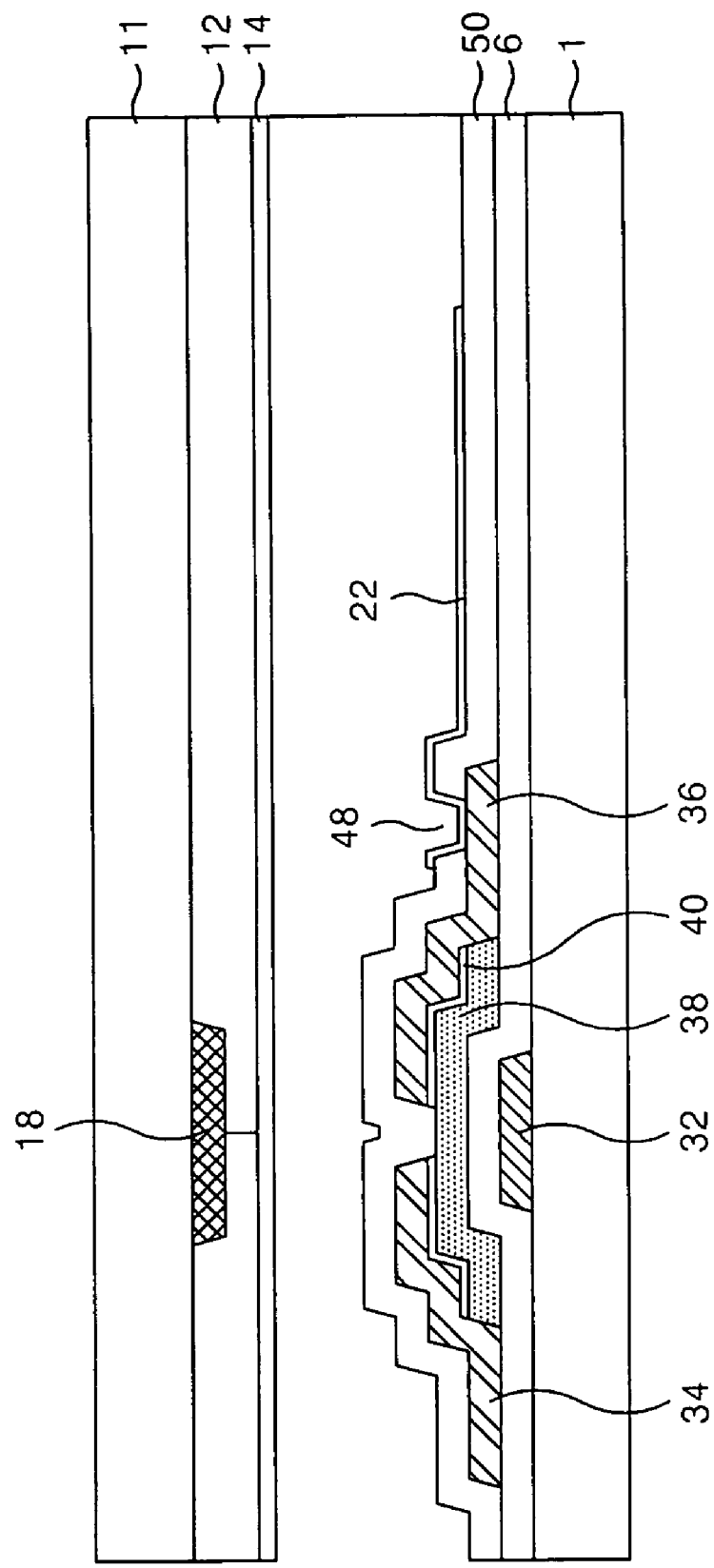
FIG. 2 is a cross sectional view representing the liquid crystal display panel of the related art in FIG. 1.
Figure 3:
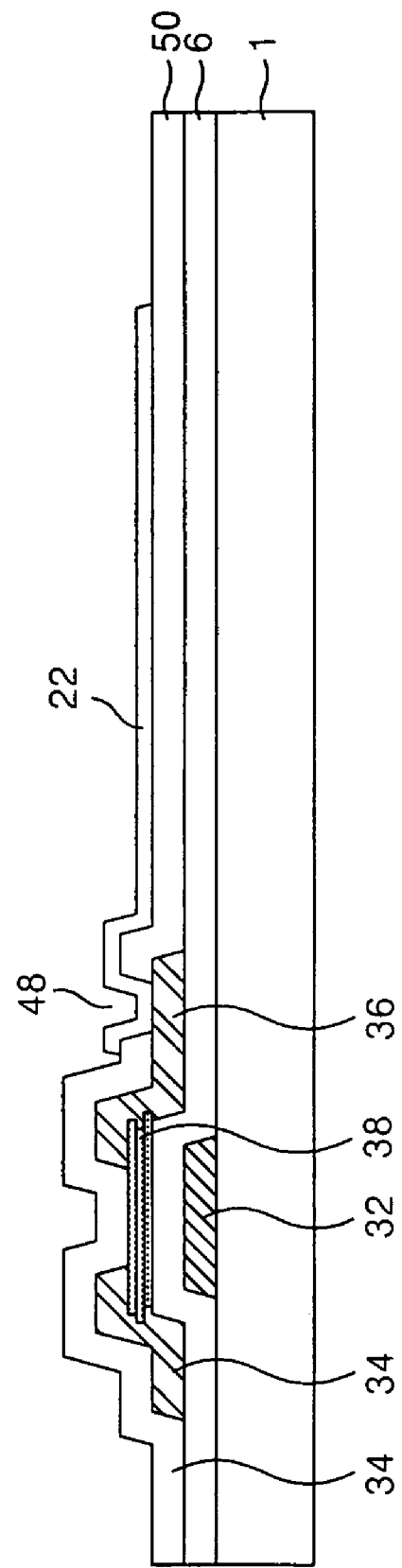
FIG. 3 is a cross sectional view representing another example of a thin film transistor substrate of the related art LCD panel.
Figure 4:
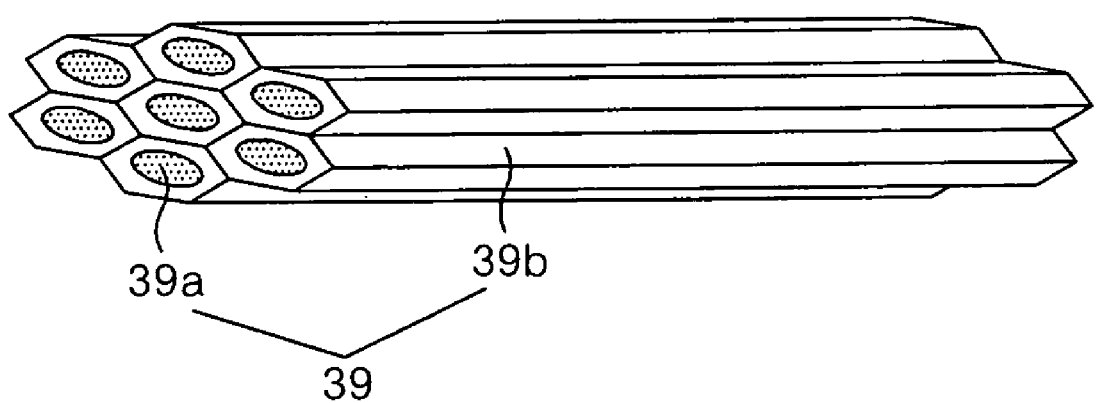
FIG. 4 is a perspective plan view representing a nanowire which forms an active layer shown in FIG. 3.
Figure 5A:
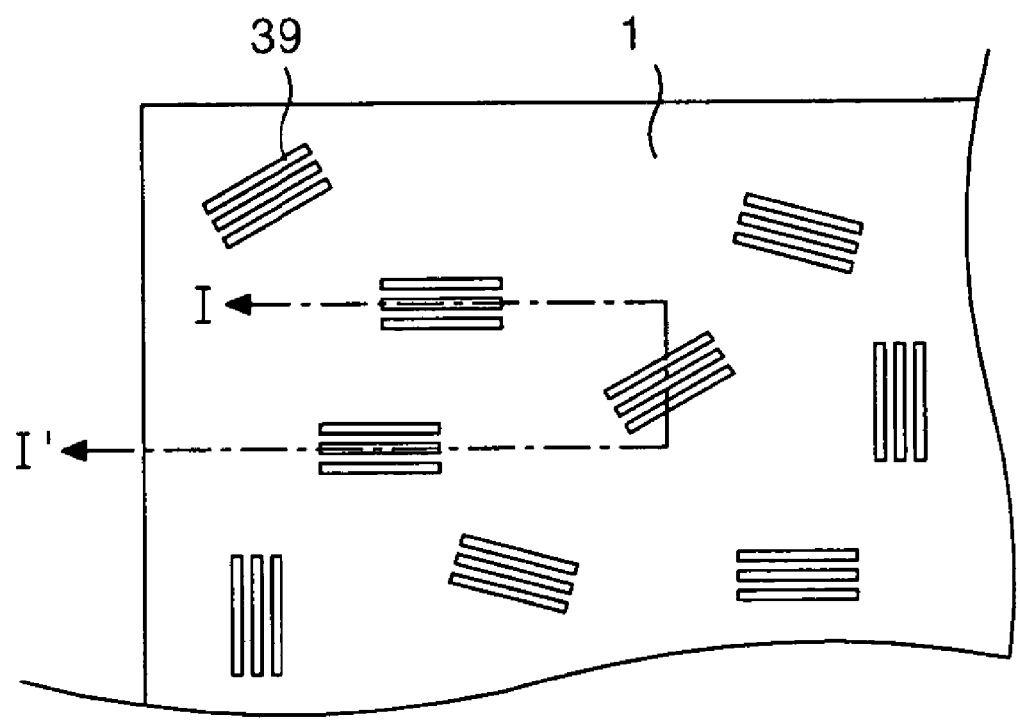
FIG. 5A is a plan view for explaining a formation of an active layer of a thin film transistor substrate by use of a related art nanowire.
Figure 5B:
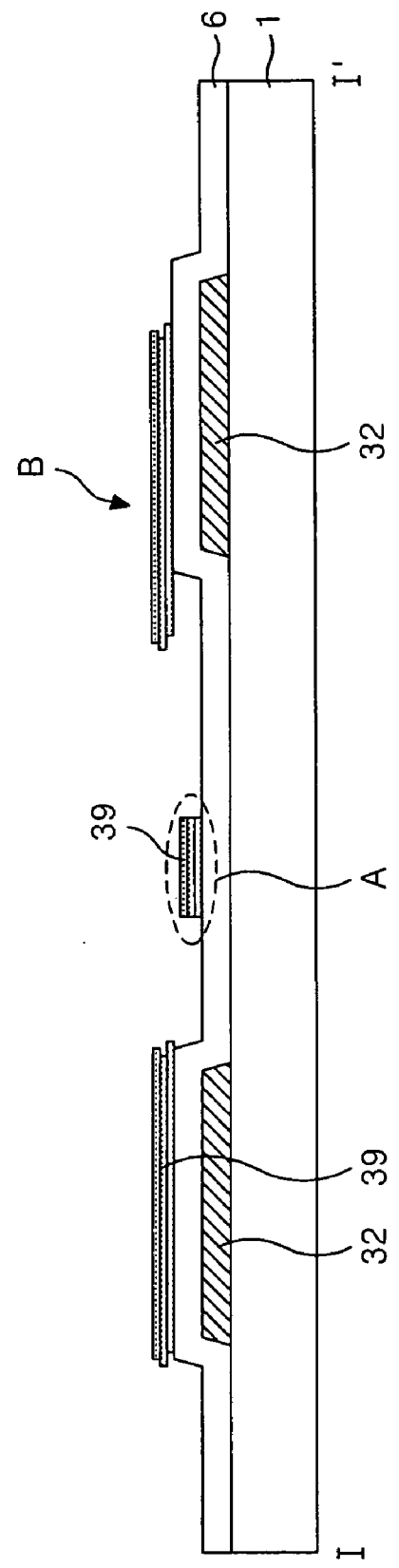
FIG. 5B is a cross sectional view taken along the line I-I' shown in FIG. 5A.

According to this embodiment of the present invention, the nanowire 139 is spread into the groove 107 of the gate insulating film 106 by use of the inkjet on the gate insulating film 106 where the groove 107 is formed in an area corresponding to the area where the active layer 138 of the TFT is to be formed. Thus the TFT substrate according to the present invention can effectively improve the yield of the liquid crystal display panel, because it reduces or eliminates patterning defects/misalignments which are generated in case of forming the active layer of the TFT in the related art as shown in FIG. 5B.

In addition, the TFT substrate according to this embodiment of the present invention forms the semiconductor layer inclusive of the active layer by use of the nanowire, and not by the photolithography process, thereby making it possible to reduce a manufacturing cost of the liquid crystal display panel.

Hereinafter, the formation of the active layer 138 of the TFT by use of the nanowire 139 will be explained in more detail in reference to FIGS. 8A to 8D according to an embodiment of the present invention.

Figure 8A:
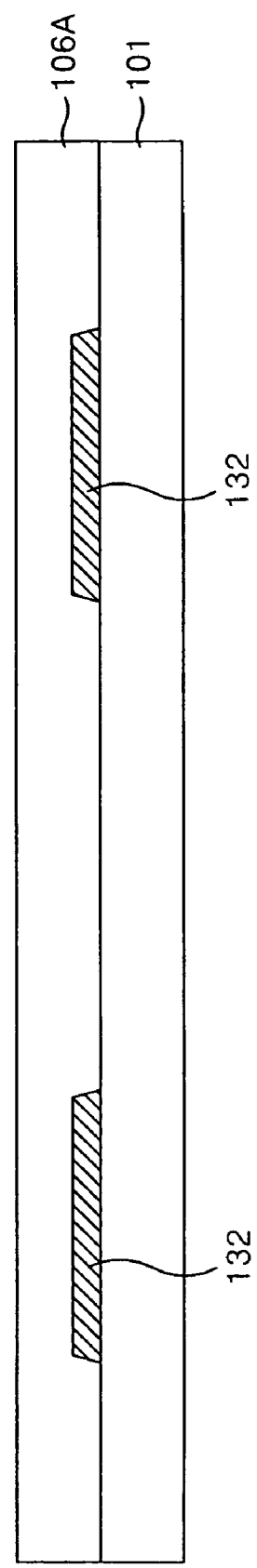

Referring to FIG. 8A, the inorganic or organic hybrid insulating material 106A is spread over the entire surface of the lower substrate 101 where the gate line and the gate electrode 132 are formed.

Figure 8B:
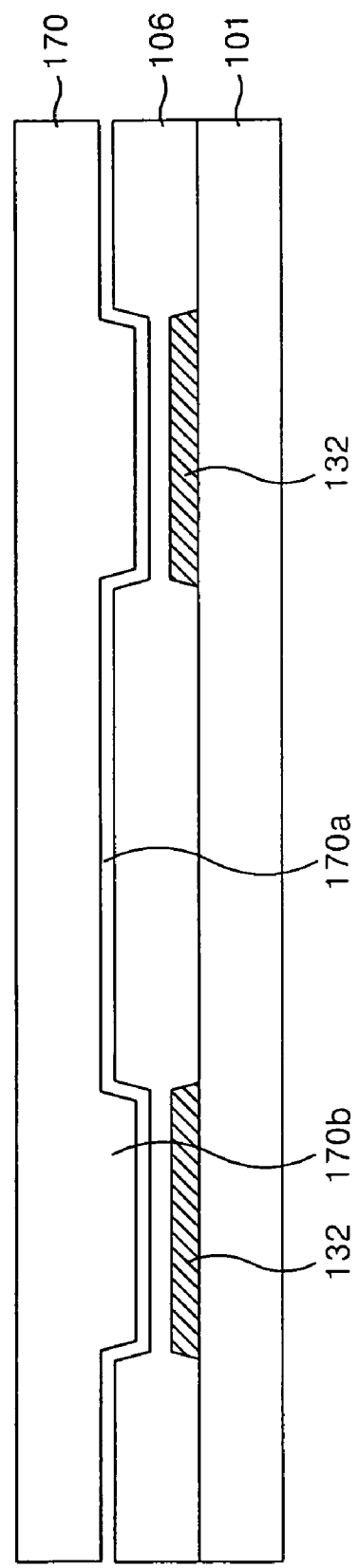

Referring to FIG. 8B, subsequently, the soft mold 170 having the projected part 170B in an area corresponding to the area where the active layer 138 of the TFT is to be formed and the groove 170A in an area elsewhere, is aligned on the lower substrate 101 where the inorganic or organic hybrid insulating material 106A is spread over the entire surface thereof. The soft mold 170 is made to be in contact with the inorganic or organic hybrid insulating material 106A which is spread over the lower substrate 101, thereby forming the gate insulating film 106 having the groove 107 in the area corresponding to the area where the active layer 138 of the TFT is to be formed.

Herein, the soft mold 170 can be a soft mold proposed in Korean Patent Application No. 10-2003-0098122 which is previously applied by the applicant(s) of the present invention. The soft mold 170 can be made of a rubber material with high elasticity, e.g., polydimethylsiloxane PDMS, polyurethane, cross-linked novolac resin, etc.

In this process, the surface of the projected part 170B of the soft mold 170 is made to be in contact with the inorganic or organic hybrid insulating material 106A, and pressure is applied thereto with about its own weight for a designated time, e.g., about 30 seconds to 10 minutes, so as to form the groove 107 of the gate insulating film 106 where the active layer 138 of the TFT is to be formed. Further, at the same time or at substantially the same time, the lower substrate 101 is baked at a temperature of about 130C or less so that the gate insulating film 106 is soft-cured by ultraviolet ray, etc. Then, the inorganic or organic hybrid insulating material 106A is made to move into the groove 170A of the soft mold 170 by a capillary force generated by a pressure between the soft mold 170 and the lower substrate 101 and a repulsive force between the soft mold 170 and the inorganic or organic hybrid insulating material 106A. Accordingly, there is formed the gate insulating film 106 where the groove 107 is formed in the area corresponding to the projected part 170B of the soft mold 170, as shown in FIG. 8B.

Figure 8D:
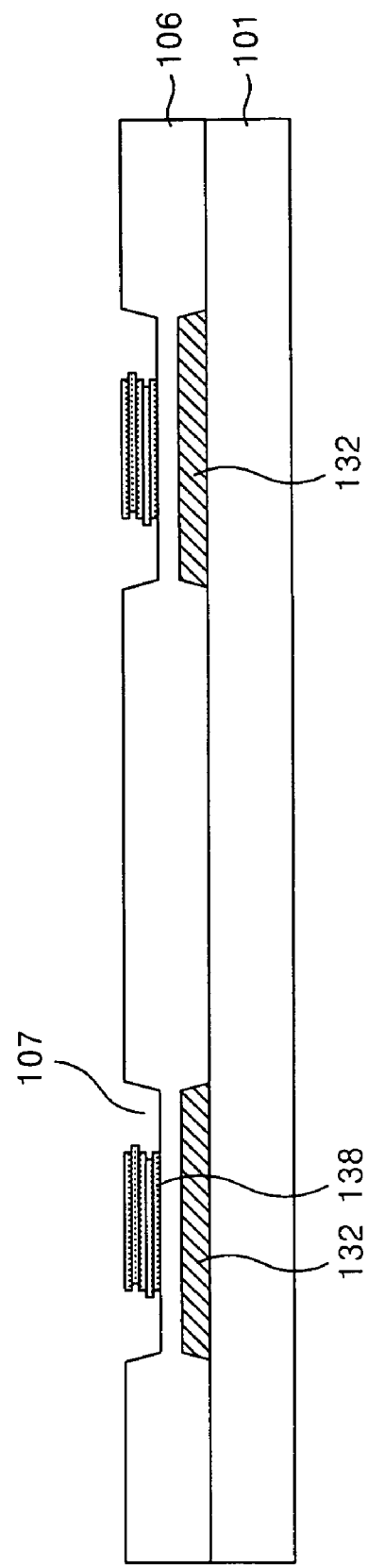

After this, the nanowire 139 dissolved in the alcohol system solvent (or the like) 137 such as ethanol, methanol, etc. by use of the inkjet or the like, as shown in FIG. 8C, is spread into the groove 107 of the gate insulating film 106. Then, the alcohol system solvent 137 such as ethanol, methanol, etc. is vaporized, thereby forming the active layer 138 of the TFT by use of the nanowire 139 in the groove 107 of the gate insulating film 106, as shown in FIG. 8D. At this moment, both ends of the active layer 138 of the formed TFT, i.e., the portions of the nanowire 139 that will be in contact with the source electrode 134 and the drain electrode 136, are heat-treated to form the active layer 138, whereby the oxidation of the active layer 138 of the TFT is prevented.

In this way, the TFT substrate according to the present invention forms the groove 107 in the gate insulating film 106 of the area corresponding to the area where the active layer 138 of the TFT is to be formed when forming the active layer 138 of the TFT by use of the nanowire 139, and spreads the nanowire 139 into the groove 107 of the formed gate insulating film 106 by use of the inkjet, thereby making it possible to prevent the patterning defects of the active layer of the TFT present in the related art.

In addition, the spreading of the nanowire in accordance with the solvent characteristic, which is often generated as the nanowire is dissolved in the alcohol system solvent such as ethanol, methanol, etc. when spreading the nanowire by use of the inkjet, is prevented by forming the groove 107 of the gate insulating film 106. This improves the yield of the TFT substrate.

Figure 9:
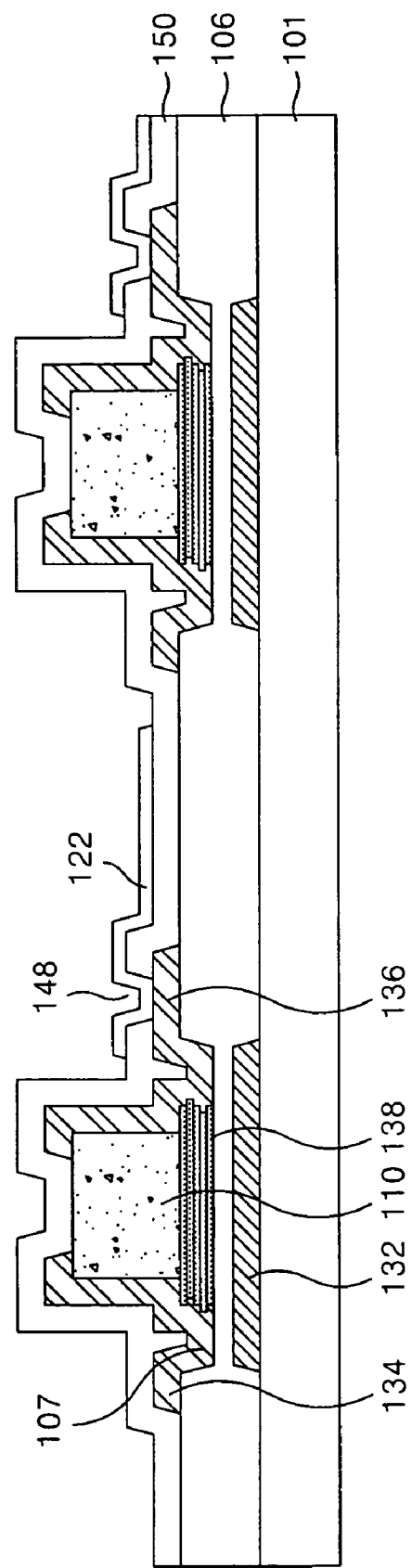
FIG. 9 is a cross sectional view representing a thin film transistor substrate of an LCD device according to another embodiment of the present invention.

FIG. 9 is a cross sectional view representing a TFT substrate of an LCD device according to another embodiment of the present invention. The TFT substrate according to this embodiment of the present invention has the same components as the TFT substrate of FIG. 6, except that the TFT substrate further includes a high molecular insulating film 110 for fixing the nanowire 139 (which forms the active layer 138) to the groove 107 of the gate insulating film 106. Thus the explanation of the same components will be omitted.

Referring to FIG. 9, the high molecular insulating film 110 is formed on the active layer 138 of the TFT, where the active layer 138 made of the nanowire 139 is provided in the groove 107 of the gate insulating film 106. This can be accomplished using known techniques such as deposition and patterning processes. Then the source electrode 134 and the drain electrode 136 are formed in the groove 107 and on the high molecular insulating film 110. Then the passivation layer 150 and the pixel electrode 122 are formed. The source electrode 134, the drain electrode 136, the passivation layer 150 and the pixel electrode 122 can be formed in the same or similar manner as the corresponding components of the TFT substrate of FIG. 6.

In FIG. 9, the high molecular insulating film 110 is formed so that the nanowire 139 (which forms the active layer 138) is not separated from the groove 107 of the gate insulating film 106 and the location of the nanowire 139 is fixed. As a result, it is possible to prevent a problem that the nanowire 139 is separated from the gate insulating film 106 by an error in the fabrication process, and the yield of the TFT substrate is further improved accordingly. Also, the high molecular insulating film 110 is not formed in an area where the source electrode 134 and the drain electrode 136 are in contact with the nanowire 139 in order to form the channel of the TFT.

According to the embodiments of the present invention, although the above discussions focus on the case of using a soft mold to form the groove of the gate insulating film, but the groove of the gate insulating film can be equally formed by using a hard mold as mentioned above. For example, the invention can use a hard mold made of, e.g., silicon or quartz, to pattern the groove of the gate insulating film in a state that a solvent component of the inorganic or organic hybrid insulating material spread over the substrate is volatilized, i.e., in a state that the inorganic or organic hybrid insulating material is imprinted, differently from the soft mold.

And, the hard mold patterns the inorganic or organic hybrid insulating material by a pressure applied from the outside and a heat of high temperature, which is different from the way the soft mold patterns the groove of the insulating film. The soft mold makes the surface of the projected part of the soft mold in contact with the inorganic or organic hybrid insulating material to apply a pressure with its own weight, so as to pattern to form the groove of the gate insulating film.

The nanowire 139, which forms the active layer 38 of the TFT, can have a structure as shown in FIG. 10. The nanowire 139 in this example includes an inorganic and/or organic insulator 139B encompassing a semiconductor material 139A such as Si, ZnO, CNT (carbon nanotube), etc. Here, the insulator 139B is in the form of a plurality of hexagonal tubes 139C connected to each other, each tube having a semiconductor material 139A therein. However, any number of tubes or the like in any shape and/or size may be provided as the nanowire 139.

Although the TFT substrate of an LCD device is discussed, the invention is applicable to a TFT substrate for other devices such as other display devices.

As described above, the fabricating method of the TFT substrate and the TFT substrate using the same according to the embodiments of the present invention forms the groove in the gate insulating film where the active layer of the TFT is to be formed when forming the active layer of the TFT by use of the nanowire, and spreads the nanowire into the groove of the formed gate insulating film by use of the inkjet or the like, thereby making it possible to prevent the patterning defects of the active layer of the TFT induced as the nanowire is randomly scattered in the related art.

In addition, the spreading of the nanowire in accordance with the solvent characteristic, which is generated as the nanowire is dissolved in the alcohol system solvent such as ethanol, methanol, etc when spreading the nanowire by use of the inkjet, is prevented by forming the groove of the gate insulating film, thereby making it possible to improve the yield of the TFT substrate.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

What is claimed is:

1. A fabricating method of a thin film transistor substrate, the method comprising:
    forming a gate electrode on a substrate;
    forming a gate insulating film on the gate electrode, the gate insulating film having a groove in an area corresponding to an area where an active layer of a thin film transistor is to be formed;
    forming the active layer of the thin film transistor by use of a nanowire in the groove of the gate insulating film; and
    forming a source electrode and a drain electrode on the active layer.

2. The fabricating method according to claim 1, further comprising:
    forming a passivation film having a contact hole that exposes a portion of the drain electrode; and
    forming a pixel electrode connected to the drain electrode through the contact hole.

3. The fabricating method according to claim 1, wherein the step of forming the gate insulating film includes:
 aligning a soft mold or hard mold having a projected part, with the area where the active layer of the thin film transistor is to be formed;
 making the soft mold or hard mold to contact a gate insulating material spread on the substrate; and
 forming a groove in the gate insulating material by applying pressure to the soft mold or hard mold.

4. The fabricating method according to claim 1, wherein the gate insulating film is made of an inorganic or organic hybrid insulating material.

5. The fabricating method according to claim 1, wherein the step of forming the active layer of the thin film transistor includes:
 spreading the nanowire into the groove of the gate insulating film by use of an inkjet.

6. The fabricating method according to claim 5, wherein the nanowire is dissolved in an alcohol system solvent, so as to be spread by the inkjet.

7. The fabricating method according to claim 1, wherein the step of forming the active layer of the thin film transistor includes:
 heat-treating end portions of the nanowire connected to the source electrode and the drain electrode.

8. The fabricating method according to claim 1, further comprising:
 forming a high molecular insulating film on the active layer of the thin film transistor, so as to fix the location of the nanowire in the groove of the gate insulating film.

9. A method of forming a thin film transistor of a liquid crystal display (LCD) device, the method comprising:
 forming a gate electrode on a substrate;
 forming a gate insulating film on the gate electrode, the gate insulating film having a groove in an area corresponding to an area where an active layer of the thin film transistor is to be formed;
 forming the active layer of the thin film transistor by forming a nanowire in the groove of the gate insulating film; and
 forming a source electrode and a drain electrode of the thin film transistor on the active layer.

10. The method according to claim 9, wherein the step of forming the gate insulating film includes:
 aligning a mold having a projected part, with the area where the active layer of the thin film transistor is to be formed;
 making the mold to contact a gate insulating material spread on the substrate; and
 forming a groove in the gate insulating material by applying pressure to the mold.

11. The method according to claim 9, wherein the step of forming the active layer of the thin film transistor includes:
 spreading the nanowire into the groove of the gate insulating film by use of an inkjet.

12. The method according to claim 11, wherein the nanowire is dissolved in an alcohol system solvent, so as to be spread by the inkjet.

13. The method according to claim 9, wherein the step of forming the active layer of the thin film transistor includes:
 heat-treating end portions of the nanowire connected to the source electrode and the drain electrode.

14. The method according to claim 9, further comprising:
 forming a high molecular insulating film on the active layer of the thin film transistor, so as to fix the location of the nanowire in the groove of the gate insulating film.

* * * * *